United States Patent [19]

Schwartz et al.

[11] Patent Number: 4,693,958

[45] Date of Patent: Sep. 15, 1987

[54] LITHOGRAPHIC PLATES AND PRODUCTION PROCESS THEREFOR

[75] Inventors: Anthony M. Schwartz, Rockville, Md.; Norimichi Kawashima, Yokohama, Japan; Albert C. Zettlemoyer, Bethlehem, Pa.

[73] Assignee: Lehigh University, Bethlehem, Pa.

[21] Appl. No.: 695,259

[22] Filed: Jan. 28, 1985

[51] Int. Cl.$^4$ ............................ G03F 7/02; G03C 5/16
[52] U.S. Cl. .................................... 430/302; 430/944; 430/270; 430/348; 430/945; 430/330; 430/326
[58] Field of Search ............... 430/302, 944, 270, 348, 430/945, 330

[56] References Cited

U.S. PATENT DOCUMENTS

| 3,574,657 | 4/1971 | Burnett | 430/944 X |
| 3,628,953 | 12/1971 | Brinkman | 430/270 X |
| 4,548,893 | 10/1985 | Lee et al. | 430/270 X |

FOREIGN PATENT DOCUMENTS 1155035  6/1969  United Kingdom ............... 430/348

OTHER PUBLICATIONS

Jerry Mastrch, *Advanced Organic Chemistry: Reactions, Mechanisms, and Structure,* Second Ed., McGraw-Hill, Series in Advanced Chemistry, McGraw-Hill, Inc., New York, N.Y., 1968, pp. 383–384.
Robert T. Morrison et al., *Organic Chemistry,* Third Edition, Allyn and Bacon, Inc., Boston, Mass., 1973, p. 672.

*Primary Examiner*—John E. Kittle
*Assistant Examiner*—Cynthia Hamilton
*Attorney, Agent, or Firm*—Ratner & Prestia

[57] ABSTRACT

Lithographic plate, and method for making same, comprises a plate substrate with a selectively ink-receptive coating in the image area of the plate, rendered ink receptive by heat conversion of an initially water-soluble polymer coating of specifically defined polymer classes.

4 Claims, No Drawings

LITHOGRAPHIC PLATES AND PRODUCTION PROCESS THEREFOR

FIELD OF THE INVENTION

This invention pertains to lithographic printing plates, formed by a practical and economic surface coating and treatment process.

BACKGROUND OF THE INVENTION

Conventional lithographic printing plates consist of a suitable substrate material having a surface comprised of a pattern of ink-receptive material surrounded by ink-rejective material.

In one lithographic plate, a substrate, such as an aluminum sheet is coated with a water-soluble resinous material which may be rendered insoluble and adherent to the substrate on exposure to ultraviolet light. Such a coated substrate is then covered with a mask such as a photographic negative and exposed to a source of ultraviolet light which causes the exposed portions of the coating to become insoluble and adherent to the substrate. Unexposed portions of the coating remain soluble so that subsequent washing of the plate removes all such unexposed material leaving bare substrate. In the printing process, the exposed and hardened portions of the coating are preferentially ink-receptive and form the image areas of the print. Substrate portions of the plate are preferentially water-receptive ink-rejective upon treatment and form the white areas of the print.

Common methods of exposure to ultraviolet light include the use of a lamp such as a mercury vapor lamp, a zenon lamp, a carbon arc lamp, or a fluorescent lamp. (U.S. Pat. No. 4,301,230) Alternatively, an ultraviolet laser may be employed. (U.S. Pat. No. 3,644,737)

If a laser of sufficiently narrow beam width and sufficiently high power is employed, the laser may be scanned over the surface at a rapid rate or may be modulated during such a scan thus eliminating the requirement of a differentially transparent mask.

Others in the art have employed a beam of laser radiation in order to transfer material from a transparent cover sheet onto a suitable substrate. (U.S. Pat. Nos. 3,945,381; 3,964,389; 4,245,003)

Also found in the prior art is a system comprising a photohardenable element disposed between a cover sheet and a support substrate. The cover sheet is formed of a transparent material to permit selected exposure of the underlying photohardenable compounds. (U.S. Pat. No. 4,126,466)

Despite such diverse methods of lithographic plate production in the prior art, applicants herein have found no suggestion of a thermally convertible selectively ink-receptive composition which may be suitable for direct use in a lithographic process.

OBJECT OF THE INVENTION

It is a primary object of this invention to provide a process for the production of lithographic printing plates wherein the plate coating may be cured by the application of heat rather than ultraviolet radiation.

It is another object of this invention to provide a process for the production of lithographic printing plates wherein the plate coating may be cured by the application of infrared radiation.

BRIEF DESCRIPTION OF THE INVENTION

The present invention comprises a process for making lithographic plates of superior quality as compared to those currently produced by conventional methods by providing a heat-curable water-soluble or hydrophilic polymeric coating which cures to become a water-insoluble hydrophobic material. Upon curing, this coating becomes the preferentially ink-receptive surface for use in conventional lithographic printing procedures. Such a coating material may be cured by the application of heat derived, for instance, from the beam of an infrared laser which is selectively applied to cure desired areas of such a coating. Alternatively, the coated plate may be covered with a mask which is partially opaque to such infrared radiation and subsequently scanned with the beam of an infrared laser. Subsequent to irradiation, the plate is preferably washed with water or a mildly alkaline aqueous solution to remove uncured portions of the coating. Such a plate is then employed in conventional lithographic printing processes.

DETAILED DESCRIPTION OF THE INVENTION

Three different classes of polymeric substances have been found to be suitable, in accordance with the present invention for use as a heat curable coating for the production of lithographic printing plates. All three classes of substances are water soluble and heat curable to form coatings which are ink-receptive.

The first class found to be suitable in practicing the present invention consists of polyamides that contain in addition to the

groups, carboxylic groups so located that they can react with the nitrogen of the amino groups to form imide rings. These carboxyl bearing polyamides may be of two types. In the first type, the

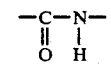

groups are integral parts of the polymer backbone. An example of this type is the polymer formed by reacting pyromellitic dianhydride with 4—4' diaminodiphenyl ether.

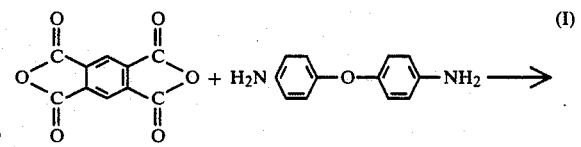  (I)

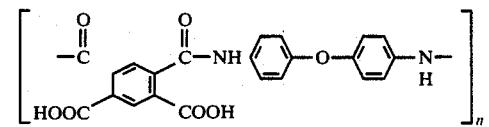

Alternatively, tetracarboxy dianhydrides such as:

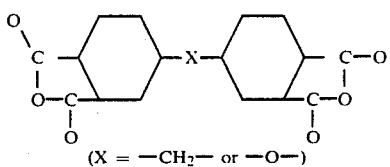

(X = —CH₂— or —O—)

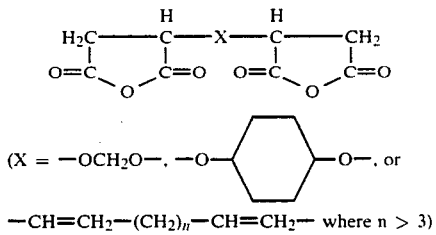

(X = —OCH₂O—, —O—<cyclohexyl>—O—, or

—CH=CH₂—(CH₂)ₙ—CH=CH₂— where n > 3)

may be substituted for pyromellitic dianhydride.

Another example of the first type of polymer is that formed by reacting benzophenone tetracarboxydianhydride with hexamethylene diamine.

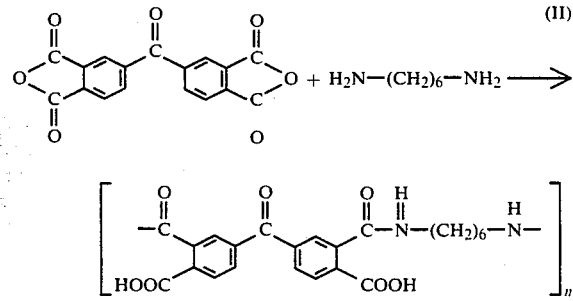

In the second type of polyamide used in the present invention, the

groups are pendant from the polymer backbone and do not form a part of the chain. Polyamides of this type may be made by reacting a polymer copolymer of maleic anhydride with an aliphatic or aromatic primary amine of suitable hydrophobicity as discussed herein. An example is the product formed by reacting ethylene-maleic anhydride copolymer with n-octyl amine.

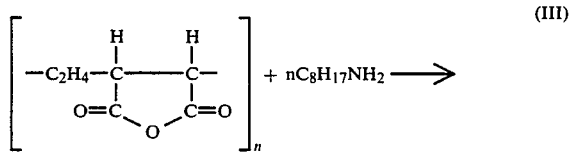

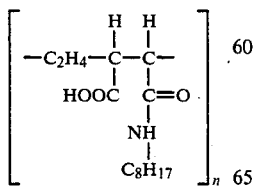

Polymers of these salts in the free carboxylic form (shown as formulas I, II, and III) generally have little solubility in water although they may be relatively hydrophilic. In the alkali metal, ammonia, or water soluble amine salt form, they are water soluble. The free carboxylic acid forms are generally soluble in polar or aromatic organic solvents.

When the free carboxylic or ammonia or amine salt forms are heated, they readily close the ring to form imides.

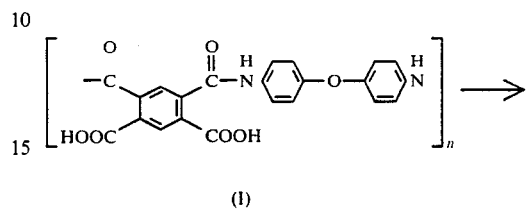

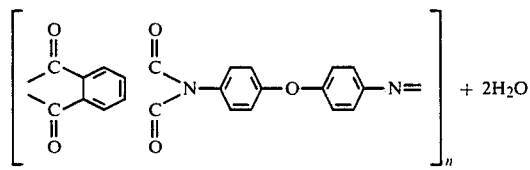

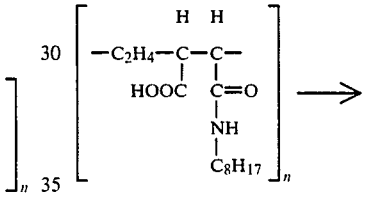

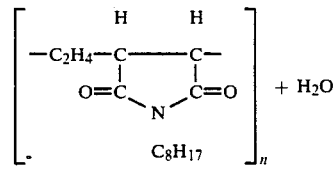

The products of these reactions are water and alkali-insoluble, hydrophobic, and preferentially ink-receptive in conventional lithographic printing processes.

The second class of heat convertible substances forming a part of the present invention are water soluble polymers containing a pendant quaternary ammonium group which is bonded to three lower alkyl chains. Examples of this class are polymers or copolymers of vinylbenzyltrimethyl ammonium chloride.

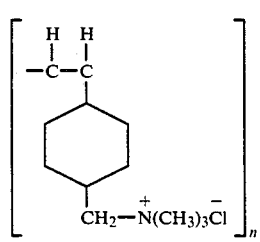

When such a material or its corresponding hydroxide is heated sufficiently, it loses trimethylamine and gives a water-insoluble, hydrophobic polymer which is preferentially ink-accepting.

The third class of heat convertible substances forming a part of the present invention are water-soluble or water-dispersible hydrophilic copolymers comprising mer units of monomer that by itself produces a water-soluble heat-crosslinkable polymer, together with mer units that by themselves produce a water-insoluble hydrophobic polymer. An example of this class of compound is the copolymer of approximately 60% styrene and 40% vinylpyrrolidone.

The copolymer of styrene and vinylpyrrolidone is water-swellable, hydrophilic, and poorly adherent to an aluminum substrate when wet. On heating, however, the vinylpyrrolidone units crosslink and the material becomes hydrophobic and adherent to the substrate. Aside from polymer chains containing vinylpyrrolidone units, chains containing vinylalcohol units may also be used since these may also be crosslinked and rendered hydrophobic and adherent by heating. An example of such a copolymer is the copolymer of styrene and vinyl alcohol, made by hydrolyzing the corresponding copolymer of styrene and vinyl acetate. Additionally, other copolymers such as vinyltoluene, or vinylalkyl ethers where the alkoxy groups consist of 4 or more C atoms may be employed.

Preparation of lithographic plates requires that a suitable substrate be prepared to accept the heat-curable polymeric films of the present invention. A preferred material is anodized aluminum sealed with either boiling water or dilute sodium silicate solution. Such an aluminum plate may, in addition, be blackened to increase thermal absorbtion, thereby decreasing the amount of energy needed to effect a full cure of the polymeric layer.

The thickness of the polymeric film on the substrate is of considerable importance, affecting both the rate and extent of cure and adhesion. Film thickness also affects printing performance and durability of the plates. Film thicknesses in the range of 0.2–5.0 microns have been found especially satisfactory. Thinner films tend to wear rapidly and display unevenness while films thicker than approximately 30 microns require excessively long curing times and/or more powerful laser beams.

It has been found helpful in some instances to disperse a black pigment or any broad band infrared absorbing pigment in the polymer coating. This pigment absorbs radiation which might otherwise be transmitted through the polymeric layer and thus fail to contribute thermal energy. Dispersed pigments absorb the impinging infrared radiation and transfer such heat to the polymer by conduction.

Not all members of the three polymer classes discussed herein above will yield conversion products which are sufficiently ink-preferring to function acceptably in convention lithography. Preferred polymers should yield a thermal conversion product with a water contact angle higher than 55° and preferably higher than 60°. Several simple screening tests are outlined in the examples that follow. Polymers displaying a water contact angle of higher than 55° should display adequate ink preference and yield acceptable results in conventional lithographic printing processes.

By way of illustration the following examples of the present invention demonstrate the formulation, selection, and use of the polymers described herein above.

EXAMPLE 1

An aqueous dispersion of the monobutylamide of ethylene-maleic acid copolymer was spread on an anodized aluminum substrate sheet in sufficient quantity to form a dried film approximately 10 microns thick. The film was air dried at room temperature. This film was swellable in water and did not show ink-preference in the test described above. After heating in a 150° C. oven for 5 minutes, the film was non-swelling in water, had a water contact angle of 68° and showed ink-preference.

EXAMPLE 2

Pyromellitic dianhydride was reacted in acetone solution with an equimolar quantity of ethylene diamine to form the polyamide:

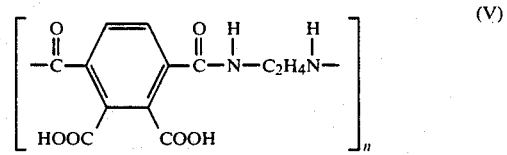

(V)

This material was spread onto anodized aluminum and air dried. The water contact angle of the dried film was 16° and it was preferentially wetted by fountain solution. After heating to 150° for 60 minutes or 300° for 15 minutes, the water contact angle was 66° and the film showed ink preference.

EXAMPLE 3

Pyromellitic dianhydride was reacted with hexamethylene diamine to form the polymer:

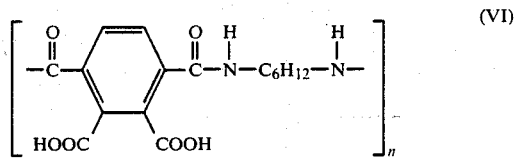

(VI)

This polymer was spread onto anodized aluminum and air dried. Its aqueous contact angle was 33° and it showed fountain solution preference. After heating to 150° for 15 minutes, the contact angle was 63° and after 15 minutes at 300° the contact angle was 75°. Both the 150° and the 300° heated samples showed ink preference.

EXAMPLE 4

Polymer I was received from a commercial source as a 14% solution in a mixed volatile organic solvent. It was spread as a thin film on an aluminum sheet and air dried. The water contact angle of the air dried film was 51°. This film was easily removable from the substrate by washing with a dilute aqueous solution of ammonia or monoethanolamine. After heating to 150° C. for 15 minutes the film became quite insoluble in aqueous ammonia and remained adherent to the aluminum substrate when washed in that reagent. The water contact angle of the cured film was 75° and it showed ink preference.

EXAMPLE 5

Poly[vinylbenzyltrimethylammonium chloride](Polymer IV) was procured as a 33.5% aqueous solution from Polysciences, Inc., Warrington, PA. A layer of this solution was spread onto an aluminum sheet and was air dried at room temperature. The coated sheet was heated at 150° in the oven. It became insoluble and progressively less swellable in water and after about 30 minutes it was completely non-swellable and had a water contact angle of 74°. It was firmly adherent to the substrate and showed ink preference.

EXAMPLE 6

A copolymer of styrene and vinyl pyrrolidone in equimolar proportions (Polymer VII) was procured from Polysciences, Inc. in the form of a 40% latex. A film of this material dried on an aluminum substrate was swellable in water and poorly adherent. After heating to 150° for 10 minutes it was non-swellable, adherent to the substrate and showed a water contact angle of 78°. This film showed ink preference in the test described above.

EXAMPLE 7

Polymer II was prepared by reacting equimolar quantities of benzophenone tetracarboxydianhydride and hexamethylene diamine. This material was spread from solvent onto aluminum sheet. In free acid form it had a water contact angle of 50° but was readily soluble in dilute aqueous ammonia or monoethanolamine. On heating to 150° for 15 minutes the film in free acid form became insoluble in aqueous alkaline solutions. It has a water contact angle of 75° and showed ink preference. Another sample of the uncured coated sheet was exposed to the vapor of boiling monoethanolamine, converting it to the water-soluble salt of that amine. Spots on this sheet were exposed to the beam of a carbon dioxide laser. The laser was adjusted to a beam diameter of 0.5 cm$^2$ and 150 watts power, furnishing a power density of 300 watts/cm$^2$. The exposed spots were completely cured to the water-insoluble ink-preferring polyimide after 2 seconds exposure. The sheet was washed with water to remove the unconverted monoethanolamine salt of Polymer II. It was then dried and used to produce acceptable prints on a laboratory litho proofing press ("Little Joe" press).

EXAMPLE 8

The copolymer of equimolar quantities of butadiene and maleic anhydride was procured from Polysciences, Inc. as a 15% solution in acetone. This copolymer was reacted with n-hexyl amine to form the amide VIII:

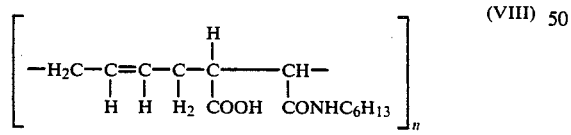

(VIII)

This material was spread onto an aluminum sheet and air dried. The film was swellable in water and had a water contact angle of 22°. After heating to 150° C. for 15 minutes, it was no longer swellable and the water contact angle had increased to 80°. An uncured sample was irradiated with a CO$_2$ laser under the conditions outlined in Example 8. The target spots were completely cured after 3 seconds. They were ink-preferring and gave satisfactory prints in the laboratory litho press.

EXAMPLE 9

A plate was prepared by spreading onto an aluminum substrate an aqueous dispersion of carbon black in Polymer IV. This dispersion contained 15% carbon based on the weight of the polymer. After air drying the plate was irradiated in a spot pattern with the 1.06 micron radiation of a Nd YAG laser. The beam diameter of the laser was 0.2 mm (200 microns) and the power 5 watts, corresponding to a power density of approximately 16,000 w/cm$^2$. A 10 millisecond exposure was required to cure. Spots exposed for only 5 miliseconds were only partially cured, becoming swollen and poorly adherent in water. The cured spots were ink receptive. The non-irradiated areas were removable by water washing.

EXAMPLE 10

A plate of Polymer VII containing approximately 10% carbon black (in weight of dry polymer) was prepared as in Example 8. This plate was exposed to the Nd YAG laser beam of diameter 0.2 mm. Adherent, cured, ink-preferring spots were obtained in 42 milliseconds at 1.6 watts power; i.e., a power density of about 5000 watts/cm$^2$. The unirradiated areas were readily washed off the aluminum substrate by flushing with water.

EXAMPLE 11

The Nd YAG laser used in this example was operated in a scanning mode. The beam, 1 mil (25.4 microns) in diameter, is scanned across the sample so that the beam's successive traces overlap by approximately half a beam width. The speed of scanning is controlled by a rotating mirror. At 16 revolutions per second (rps) the exposure time is $3.2 \times 10^{-6}$ seconds. For faster mirror speeds the exposure time is proportionately shorter. The voltage is variable from 10 watts downward. At 7 watts the power density is about $3.5 \times 10^5$ watts/cm$^2$. A plate of Polymer IV containing carbon black was prepared as in Example 9. The film thickness was measured at 0.85 microns. Exposure was made through a photographic negative of a pattern of halftone dots and solid areas. The wattage was 5.6 and the mirror speed was 16 rps. After exposure the plate was washed with water to remove the unexposed areas. It provided prints of satisfactory quality when used in the laboratory litho proofing press.

A similar plate of Polymer IV, containing carbon black and 4.4 microns thick, was exposed to direct irradiation of the laser, moving the sample to produce a striped pattern. Adherent printable stripes were obtained at 7 watts power and 26 rps mirror speed.

EXAMPLE 12

A film of Polymer VII was spread onto a chemically blackened aluminum sheet to form a plate. Thickness of the dried film was 1.5 microns. This plate was exposed in a striped pattern to the radiation of the laser of Example 11. At 20 rps and 10 watts power the stripes were cured, showing ink preference, adherence and a water contact angle of 65°.

EXAMPLE 13

A plate of Polymer VII was made by coating onto an anodized aluminum substrate. No carbon black or other pigment was added to the polymer and the substrate was not blackened or otherwise colored. The film thickness was approximately 0.5 microns. One section of the plate was exposed to radiation from the laser of Examples 11 and 12 through a photographic negative of a pattern of halftones and solid areas. A second section of the plate was exposed directly to the laser beam in a striped pattern. Exposure at 10 watts and 20 rps gave good cure on both patterns. After washing with water, the plate was used in a full size commercial litho press. Acceptable prints of good resolution were obtained.

EXAMPLE 14

A plate was made by spreading a solution of the monoethanolamine salt of Polymer I onto an anodized uncolored aluminum sheet. The solution contained no pigment or coloring substance. The dried film was approximately 1 micron thick. The plate was exposed as in Example 13, one section of halftones and solid areas through a photographic negative and the other section directly in a striped pattern. Exposure conditions were 10 watts and 20 rps. The exposed plate was washed with water, removing the areas that had not received radiation. This plate was printed on a full size commercial litho press. It gave prints of good quality and showed no signs of wear after several hundred impressions.

What is claimed is:

1. A process for the production of lithographic plates comprising the steps of:
    (a) spreading over a rigid substrate a layer of a coating polymer selected from the group consisting of:
    (i)

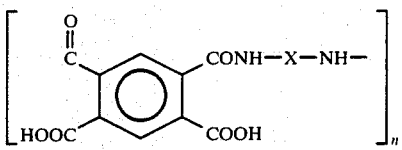

wherein X is aliphatic, aromatic, or aralkyl of a type which permits the polyimide resulting from ring-closure to be preferentially ink-receptive, and the polymer before ring-closure to be water or dilute aqueous alkaline-soluble;
    (ii)

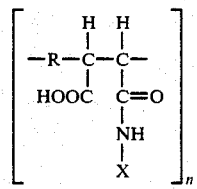

wherein X is aliphatic, aromatic, alkyl substituted aromatic, chlorine substituted aromatic, alkoxy substituted aromatic, alicyclic, or aralkyl hydrocarbon residue from 1 to 20 C atoms wherein R is the residue of a comonomer selected from the group of 2 to 12 C atom olefins, 4 to 6 atom 1–4 dienes, styrene, or hydrocarbon or halogen substituted styrenes, vinyl ethers, or vinyl halides;
    (iii) polymers or copolymers of the vinyl or acrylic type containing mer units bearing a pendant group

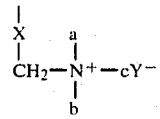

wherein
X is alkyl or aryl
Y is an anion,
a, b, c are alkyl, aralkyl or a and
b form a morpholine ring with the nitrogen in sufficient proportion to make the polymer water soluble or highly water-swellable and non-adherent to said substrate when in the water-swollen state;
    (iv) copolymers of a vinyl or acrylic monomer, whose homopolymer is water-insoluble and ink preferring, with vinylpyrrolidone in such proportion that the copolymer contains sufficient pyrrolidone residues to make it water-swellable and non-adherent to said substrate when water-swollen;
said coating polymer being hydrophilic and being curable to a hydrophobic state,
    (b) exposing said coated substrate to a source of infrared radiation in a predetermined pattern to cause said polymer coating to convert said polymer coating to a hydrophobic, ink-receptive state, in which its aqueous contact angle is greater than 55 degrees, and
    (c) Removing unexposed portions of said polymer coating by washing said plate with water or a neutral or alkaline aqueous solution.

2. The process of claim 1 wherein said source of infrared radiation is an infrared laser.

3. The process of claim 1 wherein said pattern of exposure is determined by a mask interposed between said plate and said source of infrared radiation, said mask having predetermined areas of differential transmission and absorption of said infrared radiation.

4. The process of claim 1 wherein said pattern of exposure is determined by modulation of a power of a scanning beam of infrared radiation.

* * * * *

UNITED STATES PATENT AND TRADEMARK OFFICE
CERTIFICATE OF CORRECTION

PATENT NO. : 4,693,958

DATED : September 15, 1987

INVENTOR(S) : Anthony M. Schwartz, Norimichi Kawashima, Albert C. Zettlemoyer

It is certified that error appears in the above—identified patent and that said Letters Patent is hereby corrected as shown below:

Column 2, lines 55-67:

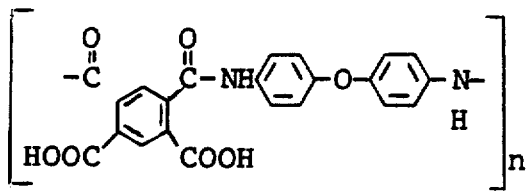

should be:

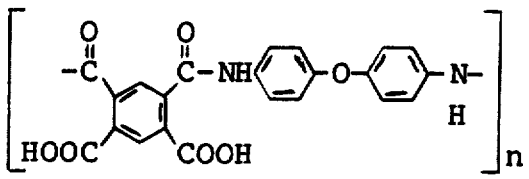

Column 3, lines 1-7:

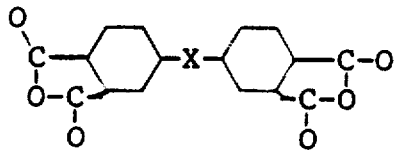 should be: 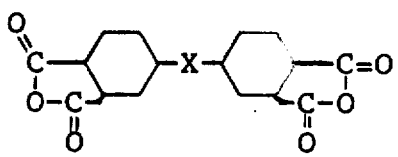

UNITED STATES PATENT AND TRADEMARK OFFICE
CERTIFICATE OF CORRECTION

PATENT NO. : 4,693,958
DATED : September 15, 1987
INVENTOR(S) : Anthony M. Schwartz, Norimichi Kawashima, Albert C. Zettlemoyer It is certified that error appears in the above—identified patent and that said Letters Patent is hereby corrected as shown below:

Column 3, lines 25-35:

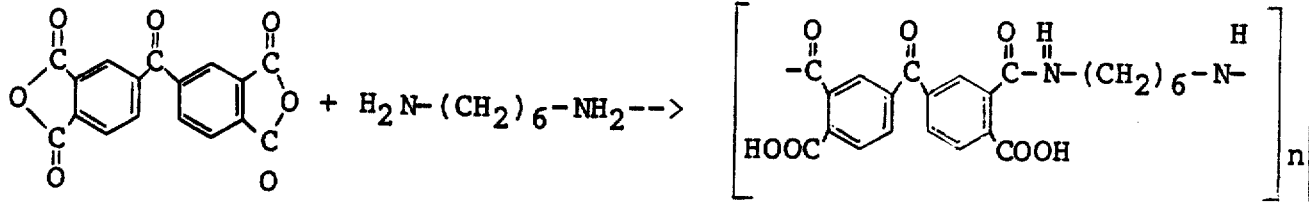

should be:

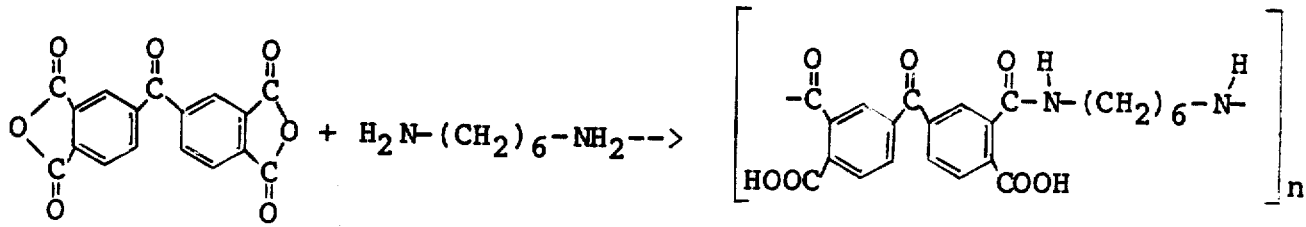

Column 4, lines 10-25:

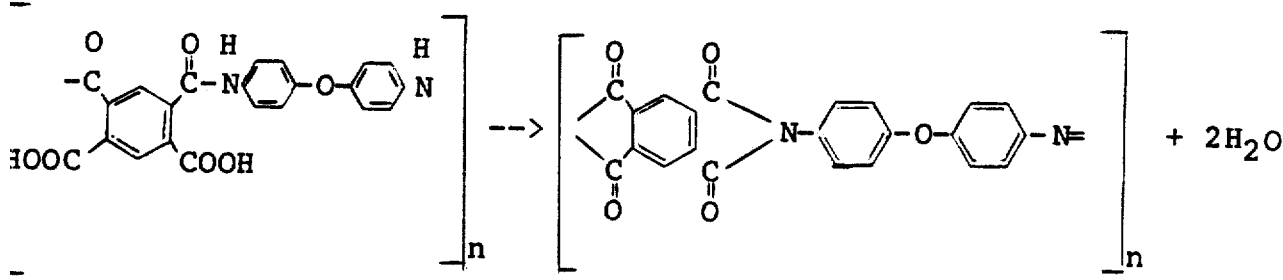

UNITED STATES PATENT AND TRADEMARK OFFICE
CERTIFICATE OF CORRECTION

PATENT NO. : 4,693,958      Page 3 of 6

DATED : September 15, 1987

INVENTOR(S) : Anthony M. Schwartz, Norimichi Kawashima, Albert C. Zettlemoyer

It is certified that error appears in the above—identified patent and that said Letters Patent is hereby corrected as shown below:

should be:

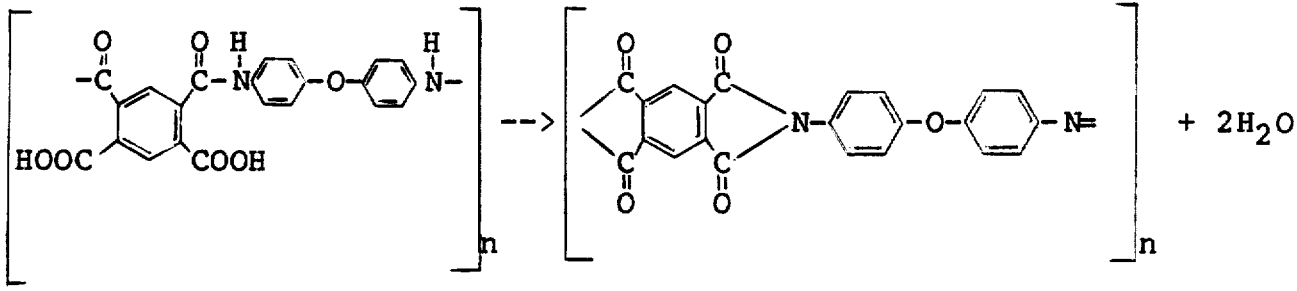

Column 4, lines 28-44:

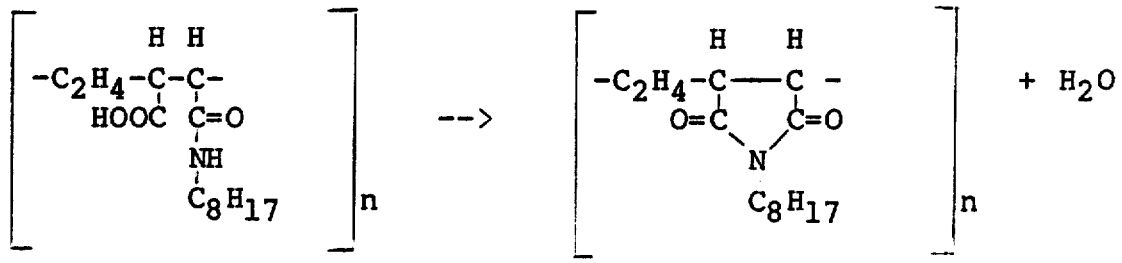

should be:

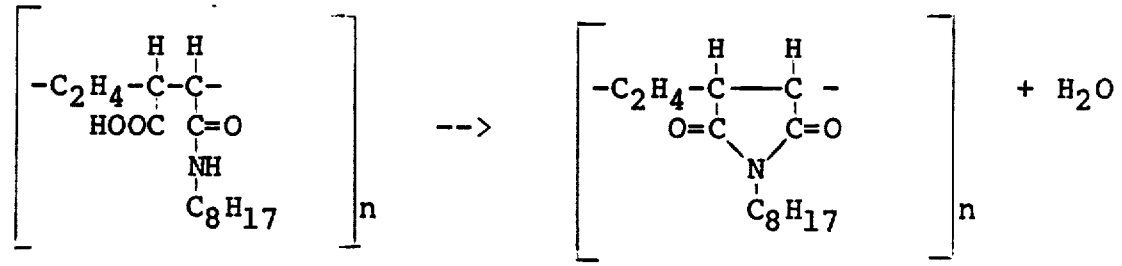

UNITED STATES PATENT AND TRADEMARK OFFICE
CERTIFICATE OF CORRECTION

PATENT NO. : 4,693,958
DATED : September 15, 1987
INVENTOR(S) : Anthony M. Schwartz, Norimichi Kawashima, Albert C. Zettlemoyer It is certified that error appears in the above—identified patent and that said Letters Patent is hereby corrected as shown below:

Column 4, lines 58-68:

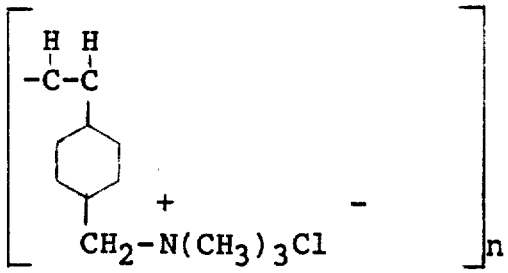

should be:

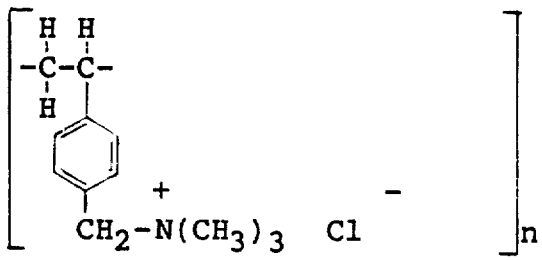

Column 6, line 28: --150°-- should be: --150°C--, and: --300°-- should be: --300°C--.
Column 6, line 47: --150°-- should be: --150°C--.
Column 6, line 48: --300°-- should be: --300°C--.
Column 6, line 49: --150°-- should be: --150°C--, and: --300°-- should be: --300°C--.
Column 7, line 3: --150°-- should be: --150°C--.
Column 7, line 15: --150°-- should be: --150°C--.
Column 7, line 27: --150°-- should be: --150°C--.

UNITED STATES PATENT AND TRADEMARK OFFICE
CERTIFICATE OF CORRECTION

PATENT NO. : 4,693,958

DATED : September 15, 1987

INVENTOR(S) : Anthony M. Schwartz, Norimichi Kawashima, Albert C. Zettlemoyer

It is certified that error appears in the above—identified patent and that said Letters Patent is hereby corrected as shown below:

Column 7, lines 50-55:

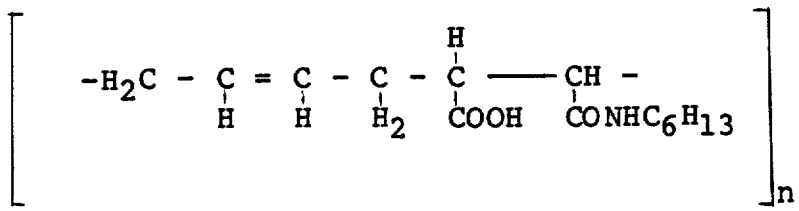

should be:

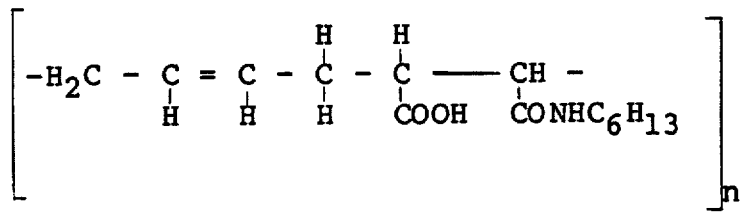

Column 9, lines 27-33:

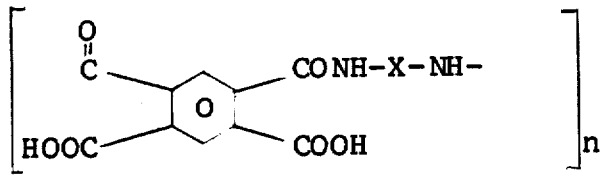

should be:

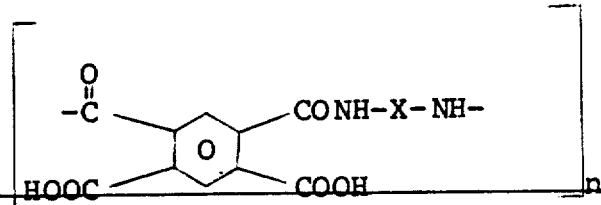

UNITED STATES PATENT AND TRADEMARK OFFICE
CERTIFICATE OF CORRECTION

PATENT NO. : 4,693,958

DATED : September 15, 1987

INVENTOR(S) : Anthony M. Schwartz, Norimichi Kawashima, Albert C. Zettlemoyer

It is certified that error appears in the above-identified patent and that said Letters Patent is hereby corrected as shown below:

Column 10, lines 10-15:

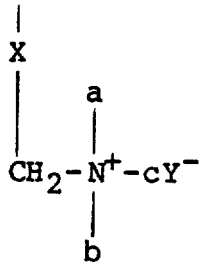

should be:

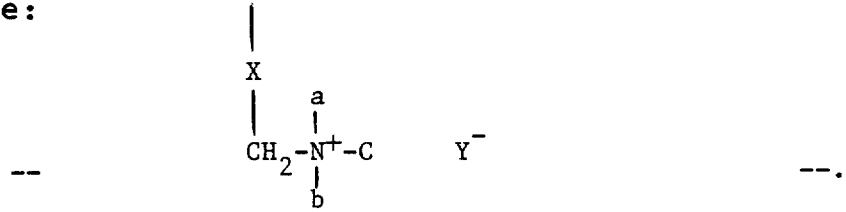

Signed and Sealed this

Fourteenth Day of March, 1989

*Attest:*

DONALD J. QUIGG

*Attesting Officer*      *Commissioner of Patents and Trademarks*